US012738767B2

(12) United States Patent
Kim et al.

(10) Patent No.: US 12,738,767 B2
(45) Date of Patent: Sep. 15, 2026

(54) WIRELESS POWER TRANSMISSION SYSTEM FOR DETECTING OPTIMAL RESONANCE FREQUENCY AND METHOD OF DETECTING OPTIMAL RESONANCE FREQUENCY USING THE SAME

(71) Applicant: BANF CO., LTD., Seoul (KR)

(72) Inventors: Young Sun Kim, Gunpo-si (KR); Sung Han You, Seoul (KR); Ji Young Song, Sejong-si (KR)

(73) Assignee: BANF CO., LTD., Seoul (KR)

( * ) Notice: Subject to any disclaimer, the term of this patent is extended or adjusted under 35 U.S.C. 154(b) by 286 days.

(21) Appl. No.: 18/713,202

(22) PCT Filed: Oct. 24, 2022

(86) PCT No.: PCT/KR2022/016286
§ 371 (c)(1),
(2) Date: May 24, 2024

(87) PCT Pub. No.: WO2023/113205
PCT Pub. Date: Jun. 22, 2023

(65) Prior Publication Data

US 2025/0030272 A1 Jan. 23, 2025

(30) Foreign Application Priority Data

Dec. 15, 2021 (KR) ........................ 10-2021-0179332

(51) Int. Cl.
*H02J 50/12* (2016.01)
*G01R 19/165* (2006.01)
(Continued)

(52) U.S. Cl.
CPC ........ *H02J 50/12* (2016.02); *G01R 19/16576* (2013.01); *G01R 23/005* (2013.01); *G01R 23/07* (2013.01); *H02J 50/80* (2016.02)

(58) Field of Classification Search
CPC .... H02J 50/12; H02J 50/80; G01R 19/16576; G01R 23/005; G01R 23/07
(Continued)

(56) References Cited

U.S. PATENT DOCUMENTS

2012/0146425 A1* 6/2012 Lee .......................... H04B 5/70 307/104
2012/0286582 A1 11/2012 Kim et al.
(Continued)

FOREIGN PATENT DOCUMENTS

KR 10-2012-0126333 A 11/2012
KR 10-2013-0107955 A 10/2013
(Continued)

OTHER PUBLICATIONS

International Search Report in International Application No. PCT/KR2022/016286, dated Feb. 15, 2023, 2pages.

*Primary Examiner* — Alfonso Perez Borroto
(74) *Attorney, Agent, or Firm* — Park, Kim & Suh, LLC

(57) ABSTRACT

The present invention relates to a wireless power transmission system for detecting an optimal resonance frequency and a method of detecting an optimal resonance frequency using the same, and provides a system and method for detecting an optimal resonance frequency for maximum wireless power transmission, the system and the method enabling an optimal resonance frequency for maximum power transmission to be effectively and quickly detected and enabling an optimal resonance frequency to be more precisely and accurately detected and found, even if a system usage situation changes, such as when a power transmission distance changes, in a wireless power transmission system of a magnetic resonant coupling scheme.

17 Claims, 12 Drawing Sheets

(51) Int. Cl.
*G01R 23/00* (2006.01)
*G01R 23/07* (2006.01)
*H02J 50/80* (2016.01)

(58) Field of Classification Search
USPC .......................................................... 307/104
See application file for complete search history.

(56) References Cited

U.S. PATENT DOCUMENTS

| | | | | |
|---|---|---|---|---|
| 2013/0010502 | A1* | 1/2013 | Chen | H02M 3/3387 363/21.02 |
| 2013/0249306 | A1* | 9/2013 | Kim | H02J 50/12 307/104 |
| 2014/0077614 | A1* | 3/2014 | Park | H02J 50/90 307/104 |
| 2016/0020634 | A1 | 1/2016 | Kanno | |
| 2016/0043564 | A1 | 2/2016 | Hatanaka et al. | |
| 2016/0056638 | A1* | 2/2016 | Hatanaka | H02J 50/12 307/104 |
| 2016/0141883 | A1* | 5/2016 | Kanno | H03J 3/20 307/104 |
| 2016/0190816 | A1* | 6/2016 | Rehm | H02J 50/12 307/104 |
| 2016/0265960 | A1* | 9/2016 | Watanabe | G01G 19/08 |
| 2016/0336804 | A1 | 11/2016 | Son et al. | |
| 2017/0101016 | A1 | 4/2017 | Seong et al. | |
| 2020/0177033 | A1 | 6/2020 | Jang et al. | |
| 2020/0381952 | A1 | 12/2020 | Jung et al. | |

FOREIGN PATENT DOCUMENTS

| | | |
|---|---|---|
| KR | 10-2017-0042944 A | 4/2017 |
| KR | 10-2017-0046494 A | 5/2017 |
| KR | 10-2020-0064420 A | 6/2020 |

* cited by examiner (a)

(b)

WIRELESS POWER TRANSMISSION SYSTEM FOR DETECTING OPTIMAL RESONANCE FREQUENCY AND METHOD OF DETECTING OPTIMAL RESONANCE FREQUENCY USING THE SAME

CROSS-REFERENCE TO RELATED APPLICATIONS

This application is the National Stage filing under 35 U.S.C. 371 of International Application No. PCT/KR2022/016286, filed on Oct. 24, 2022, which claims the benefit of Korean Patent Application No. 10-2021-0179332, filed on Dec. 15, 2021, the contents of which are all hereby incorporated by reference herein in their entirety.

TECHNICAL FIELD

The present invention relates to a system for detecting an optimal resonance frequency for wireless power transmission and a method of detecting an optimal resonance frequency using the same. More specifically, the present invention relates to a system and method that is capable of effectively and quickly detecting an optimal resonance frequency for maximum power transmission in a wireless power transmission system of a resonant coupling method even when a system usage situation changes, such as a change in an electric power transmission distance.

BACKGROUND ART

Wireless power transmission refers to a technology that supplies power to home appliances or electric vehicles wirelessly instead of conventional wired power lines, and the related research is actively being carried out for an advantage that a device that requires power can be charged wirelessly without being connected to a power outlet using a power cable.

Mainly, there are magnetic induction, magnetic resonance and microwave methods for wireless power transmission technology. The magnetic induction method is a technology that uses magnetic induction coupling between adjacent coils, and a distance between two transmission and reception coils is within a few centimeters, and the transmission efficiency is largely determined by the arrangement conditions of the two coils. The magnetic resonance method is a technology in which non-radiative magnetic field energy is transmitted between two resonators distanced from each other by resonant coupling, and which has advantages in that wireless power transmission is possible at a distance of about 1 to 2 meters between the transmission and reception coils, the alignment of the two coils is relatively flexible compared to the magnetic induction method, and the possible range of wireless charging can be extended using a relay method. The microwave method is a technology that radiates electromagnetic waves of ultra-high frequency such as microwaves through an antenna to transmit power, and it is possible to transmit wireless power over long distances, but safety issues caused by electromagnetic waves need to be taken into consideration.

A wireless power transmission system comprises a wireless power transmission device to transmit power wirelessly and a wireless power reception device to receive the power wirelessly. In general, maximum power transmission may occur in the wireless power transmission system when the wireless power transmission device and the wireless reception device have the same resonance frequency.

That is, the magnetic resonance type of wireless power transmission system can improve the transmission efficiency by maximizing a coupling effect through a magnetic resonance effect even in a state of loose coupling between the coils of the transmission unit-reception unit (large voids and the like), but there is a problem in that the transmission efficiency sharply decreases when a resonance condition is not satisfied.

In addition, currently, the magnetic induction method is being commercialized mainly for small home appliances (mobile phones, earphones, tablet PCs, and the like), while the magnetic resonance method is being applied and tried for products that require large voids and large power (automobiles, large home appliances, motors, and the like).

With high convenience and safety compared to wired transmission methods, the wireless power transmission technology is widely applied from small home appliances with small power to large power products such as electric vehicles, and many products have already been launched.

However, the magnetic induction method has many commercialization cases, but has a limitation in increasing the transmission distance, and the magnetic resonance method can secure high transmission efficiency through a resonance phenomenon in spite of a relatively long transmission distance, but the deviation of transmission efficiency is very large depending on whether the resonance condition is satisfied.

In particular, a resonance condition on the transmission unit-reception unit may be derived from a mathematical theoretical solution, but a coupling effect varies when the positions of the transmission unit and the reception unit and a distance between the transmission unit and the reception unit change, and the condition changes accordingly. In the case of the magnetic resonance method, since the transmission efficiency sharply decreases when the resonance condition is not satisfied, there is a need for a system and method that can detect an optimal resonance frequency for maximum power transmission according to a change in the transmission distance.

DISCLOSURE

Technical Problem

The present invention is directed to providing a system and method for effectively and quickly detecting an optimal resonance frequency for maximum power transmission in a wireless power transmission system with a magnetic resonant coupling method even when a system usage situation changes, such as a change in a transmission distance, and the like.

In addition, the present invention is directed to providing a system and method for detecting an optimal resonance frequency for maximum wireless power transmission with a simple detection system and an efficient detection method.

In addition, the present invention is directed to providing a system and method for detecting an optimal resonance frequency that is capable of more precisely and accurately detecting and finding an optimal resonance frequency and substantially increasing the power transmission efficiency of a wireless power transmission system.

Technical Solution

To solve the aforementioned objects, there is provided a method of detecting an optimal resonance frequency for maximum power transmission, in a method of detecting a resonance frequency of a wireless power transmission system using magnetic resonant coupling of a transmission unit and a reception unit. The method may include: (a) setting a system frequency within a preset frequency variable range and transmitting power from the transmission unit to the reception unit; (b) measuring an output voltage value of the reception unit according to the system frequency that is set; (c) determining a resonance frequency as an optimal resonance frequency when the measured output voltage value is equal to or greater than a preset receiving voltage determination value; and (d) repeating step (a), (b) and (c) by varying the system frequency within the frequency variable range.

In addition, to solve the aforementioned objects, there is provided a method of detecting an optimal resonance frequency for maximum power transmission, in a method of detecting a resonance frequency of a wireless power transmission system using magnetic resonant coupling of a transmission unit and a reception unit. The method may include: (a) setting a system frequency within a preset frequency variable range and transmitting power from the transmission unit to the reception unit, (b) measuring a current value of the transmission unit, an output voltage value and an output current value of the reception unit according to the system frequency that is set, (c) calculating power transmission efficiency using a current value of the transmission unit measured at the resonance frequency, and an output voltage value and output current value of the reception unit measured at the resonance frequency, when the measured output voltage value is equal to or greater than a preset receiving voltage determination value, (d) repeating steps starting from step (a) by varying the system frequency within the frequency variable range, and (e) determining a maximum value of the calculated power transmission efficiency as an optimal resonance frequency.

Further, the frequency variation may be an upward variation, where the system frequency varies to a higher frequency than the system frequency of the previous step, or a downward variation, where the system frequency varies to a lower frequency than the system frequency of the previous step.

Here, the frequency variation may be to vary the system frequency at predetermined intervals within a preset frequency variable range.

In this case, the preset frequency variable range may be set within a system frequency range within which power transmission using magnetic resonant coupling of the transmission unit and the reception unit is possible.

Further, the output voltage value may be a DC output voltage value or a stabilization output voltage value of the reception unit.

Further, the receiving voltage determination value for the measured stabilization output voltage value Vr may be greater than the receiving voltage determination value for the measured DC output voltage value V.

In addition, to solve the aforementioned object, there is provided a wireless power transmission system for detecting an optimal resonance frequency using magnetic resonant coupling. The wireless power transmission system may include: a transmission unit including an AC/DC conversion circuit, a DC/RF conversion circuit, a matching circuit, a control circuit, and a communication circuit to transmit power; and a reception unit including a matching circuit, a rectification circuit, a stabilization circuit, a DC/DC conversion circuit, a control circuit, and a communication circuit to receive power from the transmission unit, in which the transmission unit may transmit power to the reception unit by varying a system frequency within a preset frequency variable range, and determines at least one of frequencies at which an output voltage measured at the reception unit is equal to or greater than the preset receiving voltage determination value as an optimal resonance frequency.

In addition, to solve the aforementioned object, there is provided a wireless power transmission system for detecting an optimal resonance frequency using magnetic resonant coupling. The wireless power transmission system may include: a transmission unit including an AC/DC conversion circuit, a DC/RF conversion circuit, a matching circuit, a control circuit, and a communication circuit to transmit power; and a reception unit including a matching circuit, a rectification circuit, a stabilization circuit, a DC/DC conversion circuit, a control circuit, and a communication circuit to receive power from the transmission unit, in which the transmission unit may transmit power to the reception unit by varying a system frequency within a preset frequency variable range, and when an output voltage value measured at the reception unit is equal to or greater than a preset receiving voltage determination value, determines a maximum value among at least one power transmission efficiency calculated using a current value of the transmission unit measured at the resonance frequency and an output current value and an output voltage value of the reception unit as an optimal resonance frequency.

Further, the output voltage value may be a DC output voltage value V or a stabilization output voltage value Vr measured between the stabilization circuit and the DC conversion circuit of the reception unit.

Here, the current value of the transmission unit may be an input current value A measured between the AC/DC conversion circuit and the DC/RF conversion circuit, or an input current value A measured between the DC/RF conversion circuit and the matching circuit.

In this case, varying the system frequency may be to increase a frequency from a lowest frequency within a preset frequency variable range, or to decrease a frequency from a highest frequency within a preset frequency variable range.

Further, varying the system frequency may be to vary the system frequency at predetermined time intervals within a preset frequency range.

Advantageous Effects

According to a method of detecting an optimal resonance frequency for maximum power transmission according to the present invention, a system and method for detecting an optimal resonance frequency for wireless power transmission is provided with a simple detection system and an effective detection method by measuring an output voltage value according to a frequency variation within a preset system frequency in a wireless power transmission system using magnetic resonant coupling of a transmission unit and a reception unit, and determining an optimal resonance frequency when the measured output voltage value is equal to or greater than a preset determination value.

In addition, a method of detecting an optimal resonance frequency for maximum power transmission according to the present invention calculates power transmission efficiency using a current value of a transmission unit and a current and voltage values of a reception unit, and proposes a detection method for determining a resonance frequency at a maximum value among the calculated values of power transmission efficiency as an optimal resonance frequency having maximum power transmission efficiency, thereby providing a system and method for detecting an optimal resonance frequency that is capable of more precisely and accurately detecting and finding an optimal resonance frequency that can substantially increase the power transmission efficiency of a wireless power transmission system.

In addition, a method of detecting an optimal resonance frequency for maximum power transmission according to the present invention provides a system and method for varying a transmission distance at a preset variable interval within a preset range of transmission distances over which magnetic resonant coupling is possible and detecting an optimal resonance frequency, thereby providing a system and method for detecting an optimal resonance frequency for efficient maximum power transmission that can be applied in an environment where the transmission distance changes or to various systems or home appliances.

MODE FOR DISCLOSURE

Figure 1:
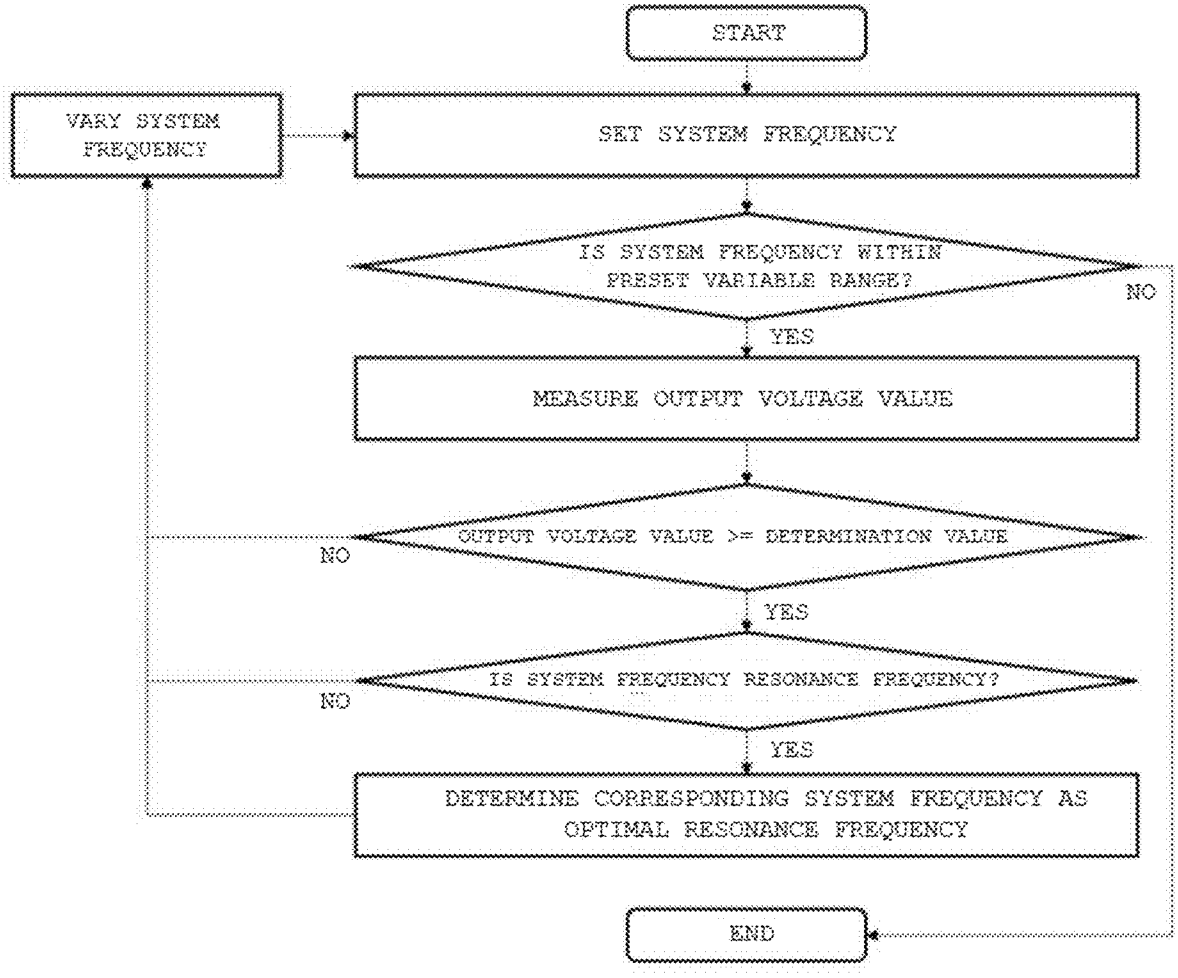
FIG. 1 is a flowchart illustrating a method of detecting an optimal resonance frequency for maximum power transmission according to an embodiment of the present invention.

Hereinafter, exemplary embodiments of the present invention will be described in detail with reference to the accompanying drawings. However, the present invention is not limited to the exemplary embodiments to be described below and may be specified as other aspects. On the contrary, the embodiments introduced herein are provided to make the disclosed content thorough and complete, and sufficiently transfer the spirit of the present invention to those skilled in the art. Like reference numerals indicate like constituent elements throughout the specification.

Hereinafter, the exemplary embodiments of the present invention will be described in detail with reference to the accompanying drawings.

Figure 2:
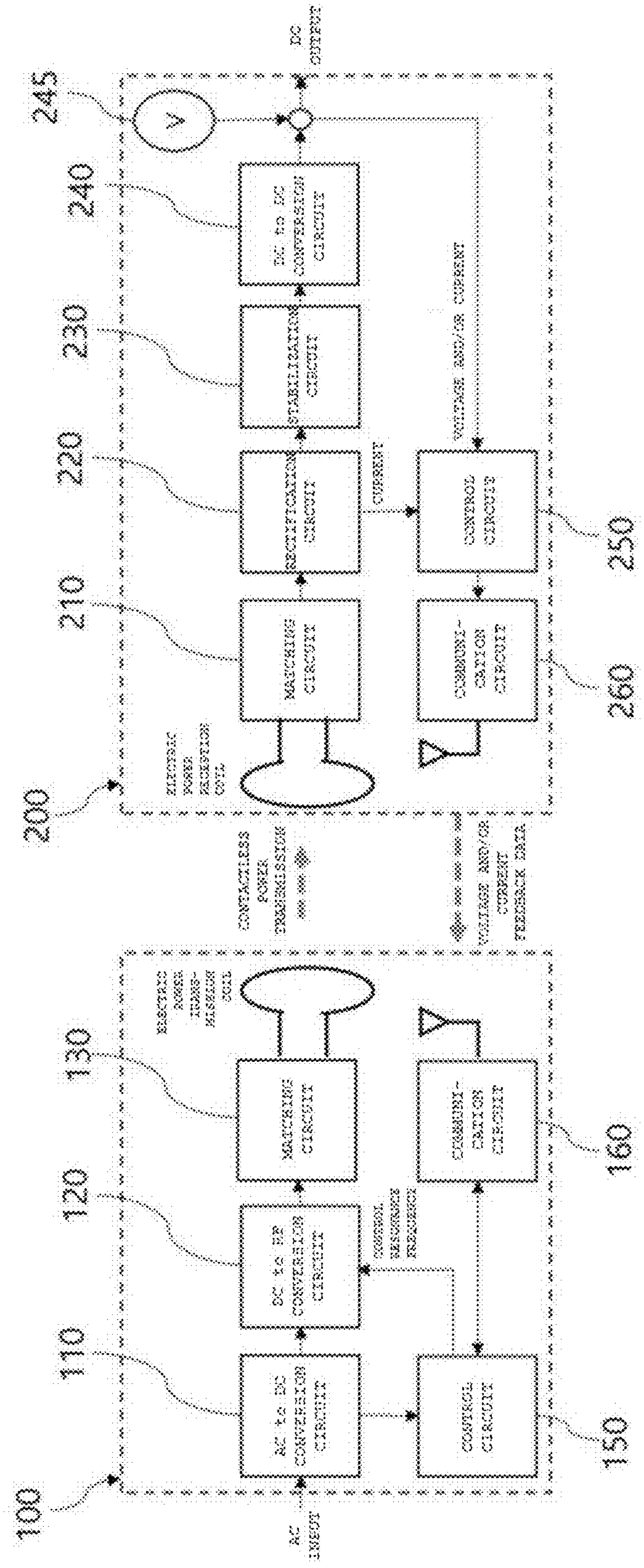
FIG. 2 illustrates a block diagram of a wireless power transmission system for detecting an optimal resonance frequency, which is applied to the method of detecting an optimal resonance frequency for maximum power transmission according to an embodiment of the present invention exemplified in FIG. 1.
Figure 3:
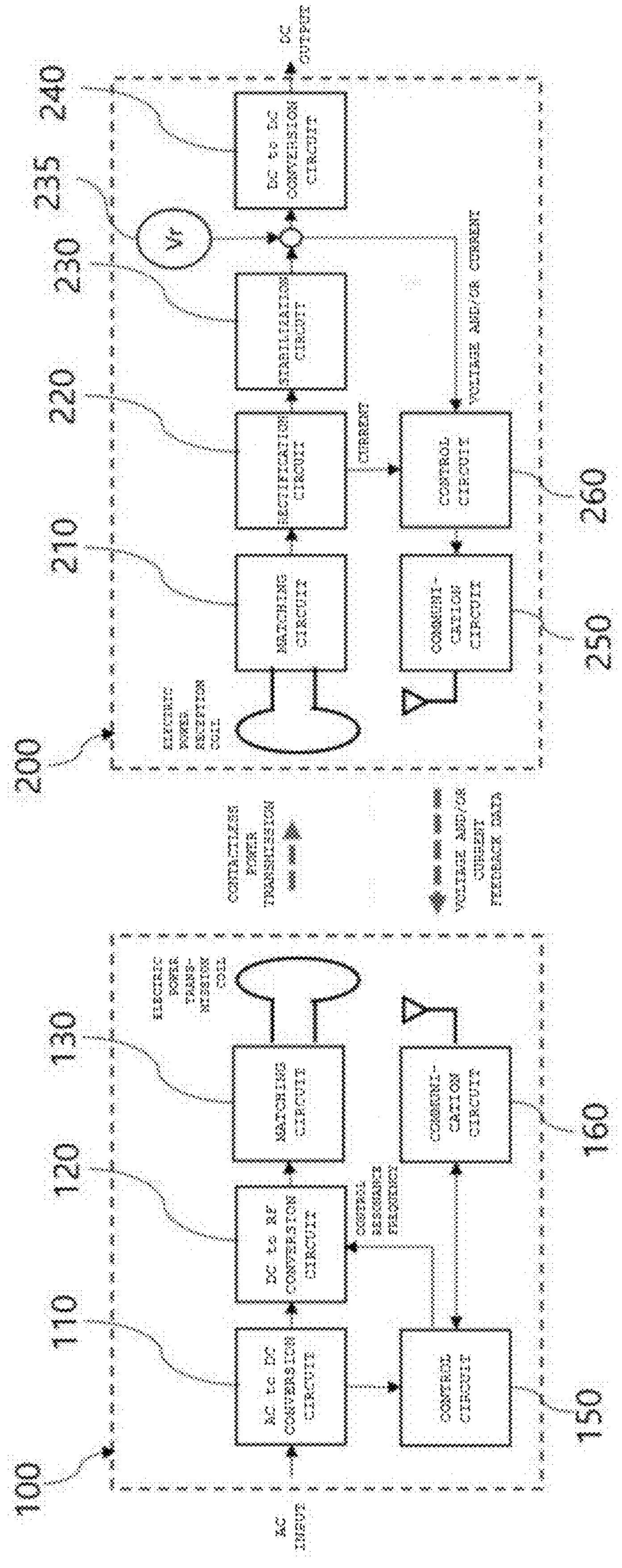
FIG. 3 illustrates a block diagram of a wireless power transmission system for detecting an optimal resonance frequency, which is applied to a method of detecting an optimal resonance frequency for maximum power transmission according to another embodiment of FIG. 1.

FIG. 1 is a flowchart illustrating a method of detecting an optimal resonance frequency for maximum power transmission according to an embodiment of the present invention, FIG. 2 illustrates a block diagram of a wireless power transmission system for detecting an optimal resonance frequency, which is applied to the method of detecting an optimal resonance frequency for maximum power transmission according to an embodiment of the present invention exemplified in FIG. 1, and FIG. 3 illustrates a block diagram of a wireless power transmission system for detecting an optimal resonance frequency, which is applied to a method of detecting an optimal resonance frequency for maximum power transmission according to another embodiment of FIG. 1.

As illustrated in FIG. 1, there is provided a method of detecting an optimal resonance frequency for maximum power transmission according to an embodiment of the present invention, in a method of detecting a resonance frequency of a wireless power transmission system using magnetic resonant coupling of a transmission unit 100 and a reception unit 200, the method may include (a) setting a system frequency within a preset frequency variable range and transmitting power from the transmission unit 100 to the reception unit 200, (b) measuring an output voltage value of the reception unit 200 according to the system frequency that is set, (c) determining a resonance frequency as an optimal resonance frequency when the measured output voltage value is equal to or greater than a preset receiving voltage determination value, and (d) repeating steps from step (a) by varying the system frequency within the frequency variable range.

As described above, the present invention proposes a method of detecting an optimum resonance frequency, which measures an output voltage value by varying a frequency within a preset system frequency and determines a resonance frequency as an optimal resonance frequency when the measured output voltage value is equal to or greater than a preset determination value in a wireless power transmission system using the magnetic resonant coupling of the transmission unit 100 and the reception unit 200. Accordingly, the present invention provides a system and method of detecting an optimal resonance frequency for maximum power transmission with a simple system configuration and method.

The system for detecting an optimal resonance frequency illustrated in FIGS. 2 and 3 may be a system according to the respective embodiments for which the method of detecting an optimal resonance frequency for maximum power transmission according to an embodiment of the present invention in FIG. 1 is applied.

As illustrated in FIG. 2, a system for detecting an optimal resonance frequency according to an embodiment of the present invention is a wireless power transmission system using a magnetic resonant coupling, the system may include the transmission unit 100 that includes an AC/DC conversion circuit 110, a DC/RF conversion circuit 120, a matching circuit 130, a control circuit 150, and a communication circuit 160 to transmit power; and the reception unit 200 that includes a matching circuit 210, a rectification circuit 220, a stabilization circuit 230, a DC/DC conversion circuit 240, a control circuit 250, and a communication circuit 260.

Further, the aforementioned transmission unit 100 transmits power to the reception unit 200 by varying the system frequency within the preset frequency variable range, and when the output voltage value measured at the reception unit 200 is equal to or greater than the preset receiving voltage determination value, a resonance frequency of a maximum value of at least one power transmission efficiency calculated using a current value of the transmission unit 100 measured at the resonance frequency and an output current value and an output voltage value of the reception unit 200 may be determined as an optimal resonance frequency.

First, the wireless power transmission system applied to an embodiment of the present invention may be configured with the transmission unit 100 to transmit power and the reception unit 200, which is positioned within a transmission distance and receives the transmitted power from the aforementioned transmission unit 100 through a magnetic resonance effect.

The transmission unit 100 may be configured to include the AC/DC conversion circuit 110 that converts an AC input current to DC, the DC/RF conversion circuit 120 that converts the DC converted by the DC conversion circuit to RF, the control circuit 150 that controls the resonance frequency when converting the DC to RF power, the matching circuit 130 for magnetic resonant coupling, an electric power transmission coil connected to the matching circuit 130, and the communication circuit 160 that transmits and receives voltage or current signals.

The reception unit 200 may be configured to include an electric power reception coil that causes coupling within a predetermined transmission distance with the aforementioned electric power transmission coil, a resonant circuit that causes a magnetic resonance effect, including the matching circuit 210, the rectification circuit 220 that rectifies a high frequency reception power signal at a downstream terminal of the resonant circuit, the voltage stabilization circuit 230 that stabilizes an output voltage rectified at a downstream terminal of the rectification circuit 220, the DC/DC conversion circuit 240 that outputs a predetermined voltage from the voltage stabilized at a downstream terminal of the voltage stabilization circuit 230, the control circuit 250 that receives a current signal from the aforementioned rectification circuit 220 and a voltage and/or current signal received at an output terminal of the DC/DC conversion circuit 240, and generates a feedback control signal, and the communication circuit 260 that transmits the feedback control signal to the communication circuit 160 of the transmission unit 100.

The system for detecting an optimal resonance frequency according to an embodiment of the present invention illustrated in FIG. 2 is a first system for which the method of detecting an optimal resonance frequency of FIG. 1 is applied, and may measure an output voltage (V) at an output terminal of the DC/DC conversion circuit 240 of the reception unit 200 while varying the system frequency within a preset frequency variable range through the control circuit of the transmission unit 100, and determine a resonance frequency as an optimal resonance frequency when the measured output voltage is equal to or greater than a preset determination voltage.

The system for detecting an optimal resonance frequency according to an embodiment of the present invention illustrated in FIG. 3 is a second system of another embodiment for which the method of detecting an optimal resonance frequency of FIG. 1 is applied, and may measure a stabilization output voltage Vr between the stabilization circuit 230 and the DC/DC conversion circuit 240 of the reception unit 200 while varying the system frequency within a preset frequency variable range through the control circuit 150 of the transmission unit 100, and determine a resonance frequency as an optimal resonance frequency when the measured stabilization output voltage Vr is equal to or greater than a preset output voltage determination value.

Hereinafter, the method of detecting an optimal resonance frequency for maximum power transmission according to an embodiment of the present invention illustrated in FIG. 1 will be described in detail with the first system and the second system as described above being applied.

First, the system frequency is set to a frequency within the preset frequency variable range through the control circuit of the transmission unit 100 of the first system and the second system, and power is transmitted to the reception unit 200 through the matching circuit 130 and the electric power transmission coil. The power is received through the resonant circuit including the electric power reception coil and the matching circuit 210 of the reception unit 200, the power is output through the rectification circuit 220, the stabilization circuit 230, and the DC/DC conversion circuit 240, the output voltage value is measured through a stabilization voltmeter 235 at the output terminal of the DC/DC conversion circuit 240, and the measured signal is transmitted to the transmission unit 100 through the control circuit 260 and the communication circuit 250.

When an output voltage value received by the control circuit 150 of the transmission unit 100 is compared with a preset output voltage determination value, and the output voltage value is equal to or greater than the determination value and the system frequency is a resonance frequency, the system frequency may be determined as an optimal resonance frequency. Then, the first system and the second system may repeat the process as described above while again varying the system frequency within the preset frequency variable range to detect and determine at least one optimal resonance frequency, as illustrated in FIG. 1.

Here, the variation of the system frequency may be an upward variation, where the system frequency varies to a higher frequency than the system frequency of the previous step, or a downward variation, where the system frequency varies to a lower frequency than the system frequency of the previous step.

That is, as illustrated in FIG. 1, when the output voltage value received by the control circuit 150 of the transmission unit 100 from the reception unit 200 is not equal to or greater than the preset output voltage determination value, or when the system frequency is not a resonance frequency, or after determining the corresponding system frequency as an optimal resonance frequency, the control circuit 150 may again vary the system frequency to another frequency within the preset variable range, which may be the downward variation to make the system frequency fall from a largest frequency of the preset variable range, or the upward variation to make the system frequency rise from a lowest frequency of the preset variable range.

In the wireless power transmission system, the resonance frequency when the power transmission efficiency is highest may be idealized as an optimal resonance frequency. However, at least one resonance frequency may be set or determined as an optimal resonance frequency in consideration of an output voltage of the system, operational efficiency, and the like. In addition, as a method of detecting and finding an optimal resonance frequency, a method of detecting an optimal resonance frequency by varying a frequency from a lowest system frequency to a higher frequency and a method of detecting an optimal resonance frequency by varying a frequency from a highest system frequency to a lower frequency may be applied. Therefore, the optimal resonance frequency detected through the two methods may be different.

In addition, it is desirable to vary the system frequency within a preset frequency variable range at preset time intervals. To this end, the optimal resonance frequency for maximum power transmission may be detected quickly, reliably, and efficiently by varying the system frequency at preset frequency intervals, since detecting the optimal resonance frequency by continuous frequency variation not only takes a long time to detect, but also may increase the probability of error occurrence with a large burden on the detection system due to frequent changes in the system frequency.

Further, as illustrated in FIG. 1, in an embodiment of the present invention, when the system frequency is not a frequency within a preset variable range, the detection process may be terminated, since this may be an error in setting the system frequency within the preset variable range, and there is no reason to detect any further, given that the detection is terminated and the frequency is outside the variable range.

In addition, with the method of detecting an optimal resonance frequency according to an embodiment of the present invention, the optimal resonance frequency may be detected by varying a transmission distance at a preset variable interval within a preset transmission distance range within which magnetic resonant coupling of the transmission unit 100 and the reception unit 200 is possible, which is intended to detect an optimal resonance frequency for maximum power transmission in an environment in which the transmission distance changes, in that in the wireless power transmission system applicable to various systems or home appliances, a distance between the transmission unit 100 and the reception unit 200 may be variable.

Further, the output voltage value applied to the method of detecting an optimal resonance frequency according to an embodiment of the present invention may be a DC output voltage value V of the reception unit 200 of the first system, and may be a stabilization output voltage value Vr of the reception unit 200 of the second system. As illustrated in FIG. 2, the output voltage value of the first system may be a value measured by a voltmeter 245 at an output terminal of the DC/DC conversion circuit 240, and as illustrated in FIG. 3, the stabilization output voltage value Vr of the second system may be a value measured by the stabilization voltmeter 235 between the stabilization circuit 230 and the DC/DC conversion circuit 240.

As illustrated in FIG. 3, the stabilization circuit 230 of the second system may be provided between the rectification circuit 220 and the DC/DC conversion circuit 240 of the reception unit 200 to increase the output stability in order to prevent the risk of damage to elements caused by severe fluctuations in the output voltage value due to load fluctuations of the output terminal and to ensure system stability. In the case of the second system provided with the stabilization circuit 230 as described above, a more stable process of detecting an optimal resonance frequency may be proceeded by allowing the output voltage value to be the stabilization output voltage value Vr measured between the stabilization circuit 230 and the DC/DC conversion circuit 240.

Further, the receiving voltage determination value for the measured stabilization output voltage value Vr may be greater than the receiving voltage determination value for the measured DC output voltage value V. This is because the stabilization output voltage has the characteristic of increasing or decreasing in proportion to the amount of power received.

Figure 4:
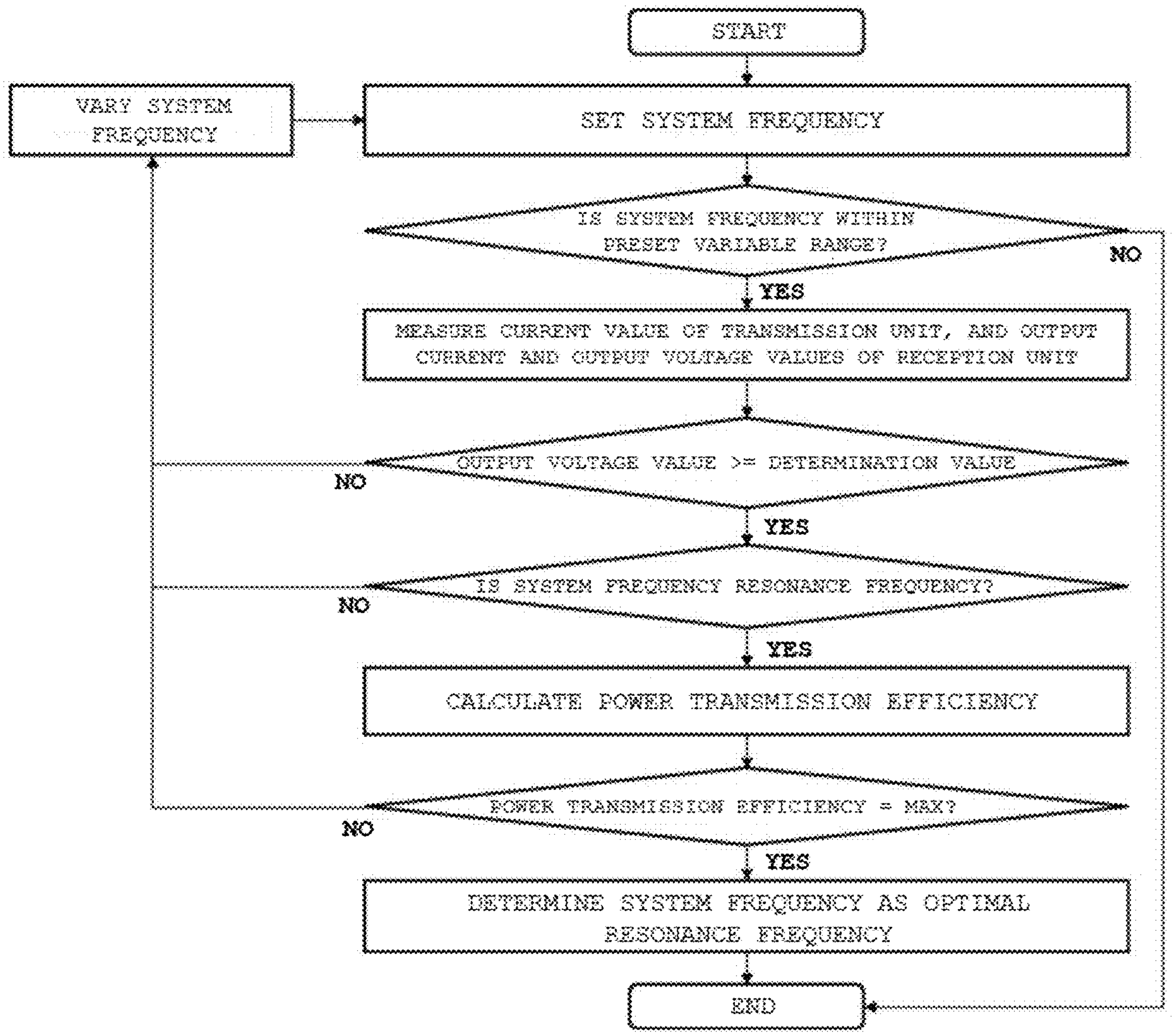
FIG. 4 illustrates a flowchart of the method of detecting an optimal resonance frequency for maximum power transmission according to another embodiment of the present invention.
Figure 5:
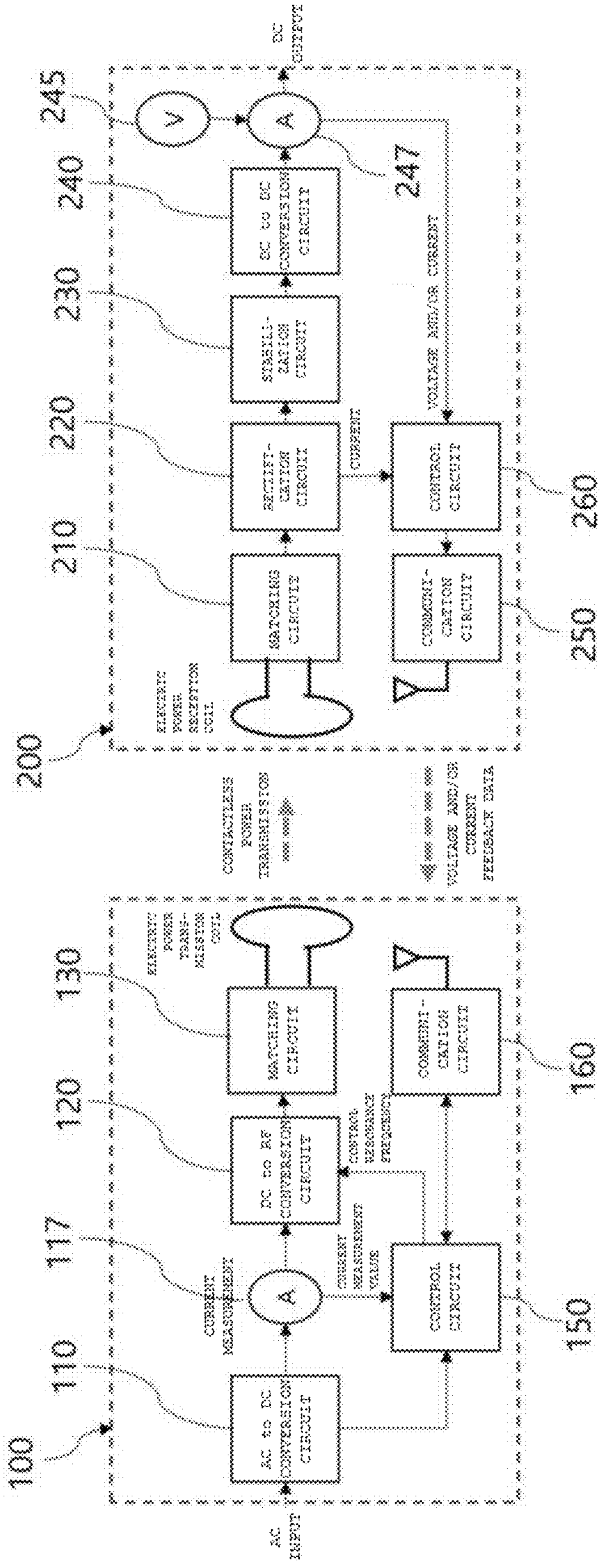
FIG. 5 illustrates a block diagram of a wireless power transmission system for detecting an optimal resonance frequency, which is applied to the method of detecting an optimal resonance frequency for maximum power transmission according to an embodiment of the present invention exemplified in FIG. 4.
Figure 6:
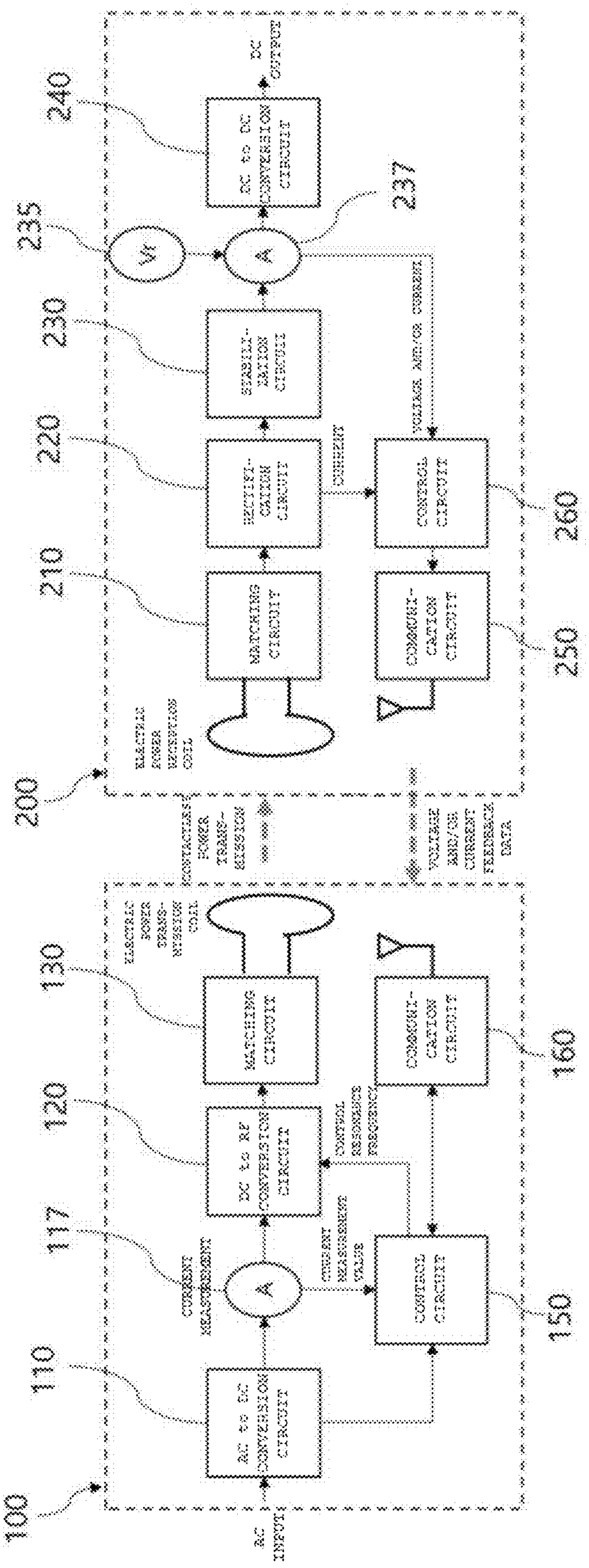
FIG. 6 illustrates a block diagram of a wireless power transmission system for detecting an optimal resonance frequency, which is applied to a method of detecting an optimal resonance frequency for maximum power transmission according to another embodiment of FIG. 4.

FIG. 4 illustrates a flowchart of the method of detecting an optimal resonance frequency for maximum power transmission according to another embodiment of the present invention, FIG. 5 illustrates a block diagram of a wireless power transmission system for detecting an optimal resonance frequency, which is applied to the method of detecting an optimal resonance frequency for maximum power transmission according to an embodiment of the present invention exemplified in FIG. 4, and FIG. 6 illustrates a block diagram of a wireless power transmission system for detecting an optimal resonance frequency, which is applied to a method of detecting an optimal resonance frequency for maximum power transmission according to another embodiment of FIG. 4.

The system for detecting an optimal resonance frequency according to an embodiment of the present invention illustrated in FIG. 5 is a third system for which the method of detecting an optimal resonance frequency of FIG. 4 is applied, and may measure an input current value A and the output voltage value V from the output terminal of the DC/DC conversion circuit 240 of the reception unit 200 while varying the system frequency within a preset frequency variable range through the control circuit 150 of the transmission unit 100, calculate power transmission efficiency through the input current value A and output voltage value V in the corresponding system frequency when the measured output voltage value Vr is equal to or greater than a preset reception voltage determination value, and determine a resonance frequency corresponding to a maximum value as an optimal resonance frequency.

Here, the current value of the transmission unit 100 may be an input current value A measured between the AC/DC conversion circuit and the DC/RF conversion circuit, or an input current value A measured between the DC/RF conversion circuit and the matching circuit.

The system for detecting an optimal resonance frequency according to an embodiment of the present invention illustrated in FIG. 6 is a fourth system of still another embodiment for which the method of detecting an optimal resonance frequency of FIG. 4 is applied, and may measure the input current value A of the transmission unit 100 and the stabilization output voltage value Vr between the stabilization circuit 230 and the DC/DC conversion circuit 240 of the reception unit 200 while varying the system frequency within a preset frequency variable range through the control circuit 150 of the transmission unit 100, calculate power transmission efficiency through the input current value A, and output current value A, and the stabilization output voltage value Vr in the corresponding system frequency when the measured stabilization output voltage value Vr is equal to or greater than the preset reception voltage determination value, and determine a resonance frequency corresponding to a maximum value as an optimal resonance frequency.

Hereinafter, using the third system of FIG. 5 and the fourth system of FIG. 6, a method of detecting an optimal resonance frequency for maximum power transmission according to an embodiment of the present invention illustrated in FIG. 4 will be described in detail.

As illustrated in FIG. 4, there is provided a method of detecting an optimal resonance frequency according to an embodiment of the present invention, in the method of detecting a resonance frequency in the wireless power transmission system using the magnetic resonant coupling of the transmission unit 100 and the reception unit 200, the method may include (a) setting a system frequency within a preset frequency variable range and transmitting power from the transmission unit 100 to the reception unit 200, (b) measuring a current value of the transmission unit 100, an output voltage value and an output current value of the reception unit 200 according to the system frequency that is set, (c) calculating power transmission efficiency using a current value of the transmission unit 100 measured at the resonance frequency, and an output voltage value and output current value of the reception unit 200 measured at the resonance frequency, when the measured output voltage value is equal to or greater than a preset receiving voltage determination value, (d) repeating steps starting from step (a) by varying the system frequency within the frequency variable range, and (e) determining a resonance frequency of a maximum value of the calculated power transmission efficiency as an optimal resonance frequency.

More specifically, the frequency within the preset system variable range is set as the system frequency and the power is transmitted through the transmission unit 100. When the system frequency that is set does not correspond to a frequency within the preset variable range, the detection of an optimal resonance frequency through the system is terminated. As described above, this is because the detection process may be terminated when the system frequency that is set is a frequency that is incorrectly set outside the preset variable range, or when the detection process that has been normally proceeded deviates from the variable range.

When the system frequency that is set corresponds to a frequency within the preset variable range, the input current values from the transmission units of the third system and the fourth system are measured, and the output current and voltage values of the reception unit 200 are measured.

When the measured output voltage value is equal to or greater than the preset receiving voltage determination value, it is determined whether the system frequency corresponds to the resonance frequency, and when the system frequency corresponds to the resonance frequency, the power transmission efficiency is calculated using the input current value measured at the transmission unit 100 at the corresponding frequency and the current and voltage values measured at the reception unit 200. Here, when the measured output voltage value is not equal to or greater than the preset receiving voltage determination value or when the system frequency is not the resonance frequency, the steps from the step of setting the system frequency described above are repeated again.

Further, it is determined whether the calculated power transmission efficiency is a maximum value, and when the calculated power transmission efficiency is not a maximum value, the steps from the step of setting the system frequency is repeated by varying the frequency, and when the power transmission efficiency is a maximum value, the corresponding system frequency or resonance frequency is determined as an optimal resonance frequency. Since the embodiments of the present invention, such as a range of setting of a frequency variable range, a detection method according to a direction of varying the frequency, and a method of detecting an optimal frequency according to a variation of the transmission distance, are the same as the embodiment of FIG. 1, the description thereof will be omitted.

As described above, the method of detecting an optimal resonance frequency for maximum power transmission according to an embodiment of the present invention, in contrast to the embodiment of FIG. 1, has an advantage of more precisely and accurately detecting and finding an optimal resonance frequency, which may substantially increase the power transmission efficiency of the system, by proposing a detection method of measuring an input current value, an output current value, and an output voltage value, calculating power transmission efficiency using the measured values, and determining a system frequency or resonance frequency corresponding to the maximum value of the calculated power transmission efficiency value as an optimal resonance frequency having maximum power transmission efficiency, and by proposing a method of more directly detecting an optimal resonance frequency for maximum power transmission.

Figure 7:
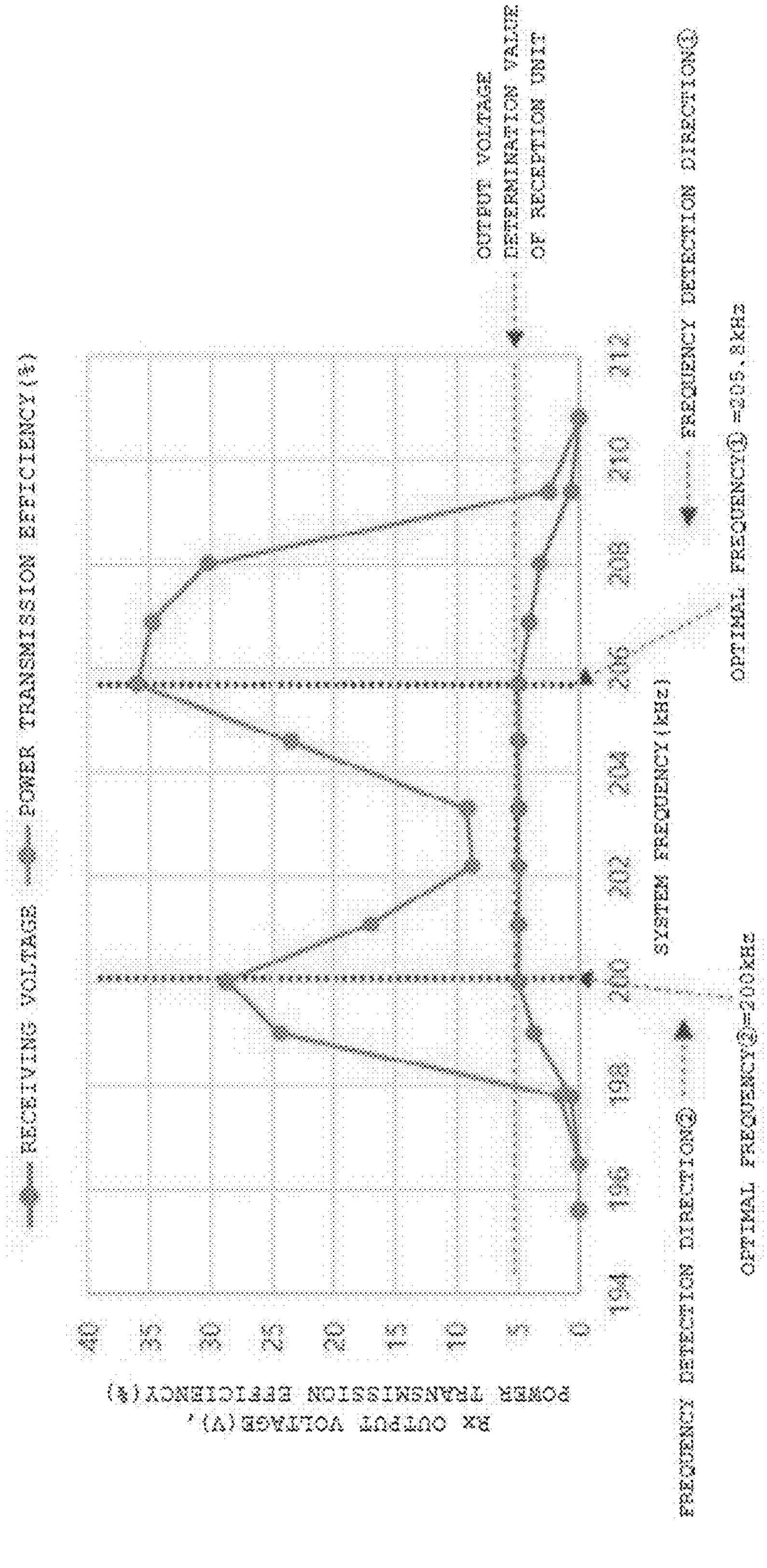
FIG. 7 is a graph illustrating response characteristics of an output voltage of a reception unit and a transmission efficiency according to changes in frequency using the method of detecting an optimal resonance frequency according to an embodiment of the present invention.

FIG. 7 is a graph illustrating response characteristics of an output voltage of a reception unit and a transmission efficiency according to changes in frequency using the method of detecting an optimal resonance frequency according to an embodiment of the present invention.

FIG. 7 is a graph illustrating a response characteristic of the received voltage and transmission efficiency according to a frequency change of a system in which the matching circuit is optimized for a resonance frequency of 205.8 kHz and a transmission distance of 80 mm. As illustrated in FIG. 7, ① a downward variation method, which varies a frequency in the direction of decreasing a frequency from a highest frequency within a preset frequency variable range, and ②, an upward variation method, which varies a frequency in the direction of increasing a frequency from a lowest frequency within a preset frequency variable range, may be applied as a detection method of varying a frequency.

The preset frequency variable range is defined to be 185 kHz to 215 kHz, and the process of detecting an optimal resonance frequency according to the present embodiment is proceeded using the first system and the third system. When an optimal resonance frequency is detected by applying the downward variation method of ① at the highest frequency of 215 kHz, it can be seen that the output voltage of the reception unit 200 has reached the preset output voltage determination value (5V) at 205.8 kHz, in which case the power transmission efficiency is maximized, so that the result of detecting the optimal resonance frequency of this system is determined to be 205.8 kHz.

In addition, when an optimal resonance frequency is detected by applying the upward variation method of ②, at the lowest frequency of 185 kHz, it can be seen that the output voltage of the reception unit 200 has reached the preset output voltage determination value (5V) at 200 kHz, in which case the power transmission efficiency is maximized, so that the result of detecting the optimal resonance frequency of this system is determined to be 200 kHz.

Figure 8:
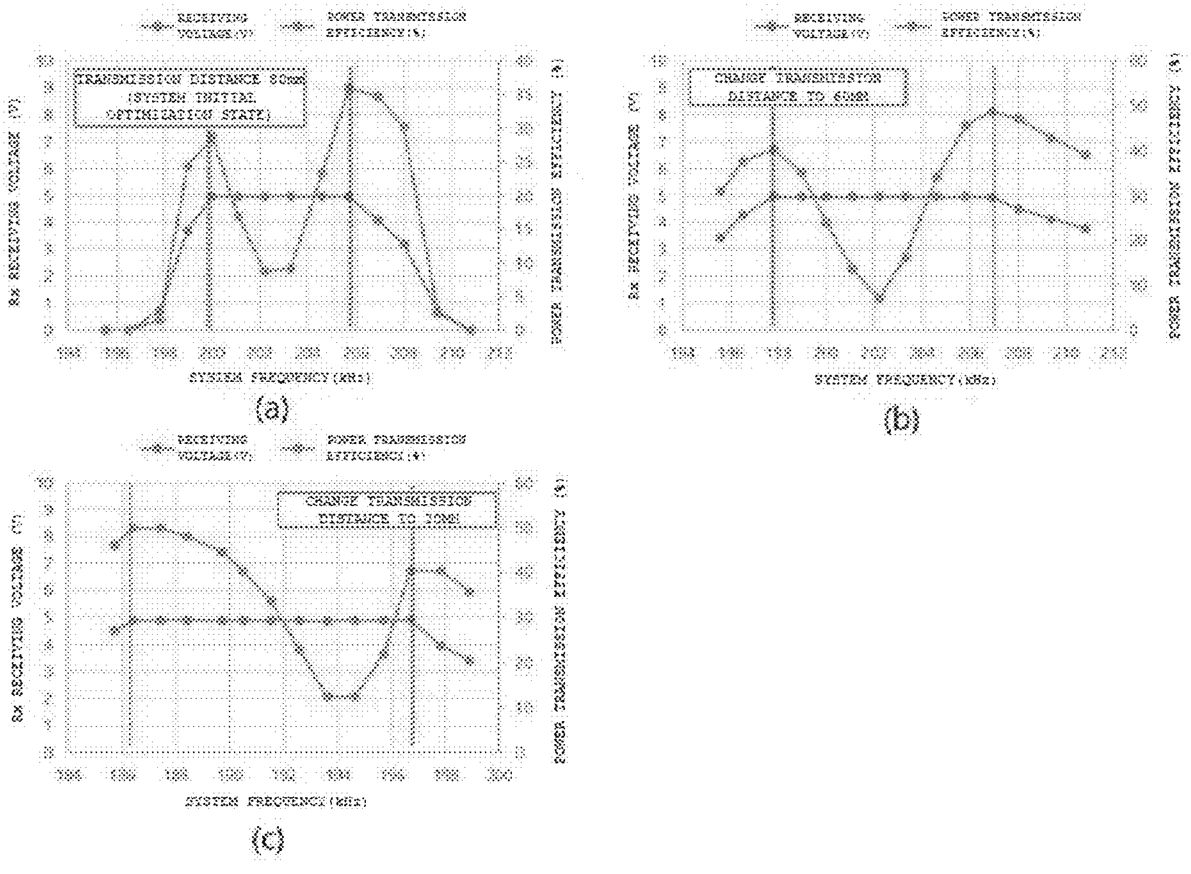
FIG. 8 illustrates graphs of frequency response characteristics of detecting an optimal resonance frequency while decreasing a transmission distance using the method of detecting an optimal resonance frequency according to an embodiment of the present invention.

FIG. 8 is graphs illustrating response characteristics of the output voltage of the reception unit 200 and transmission efficiency according to changes in frequency using the method of detecting an optimal resonance frequency according to an embodiment of the present invention, and illustrates graphs of frequency response characteristics of detecting an optimal resonance frequency while decreasing a transmission distance.

FIG. 8A is a graph illustrating the output voltage of the reception unit 200 and the response characteristics of the transmission efficiency according to changes in frequency at a transmission distance of 80 mm, FIG. 8B is a graph illustrating the output voltage of the reception unit 200 and the response characteristics of the transmission efficiency according to changes in frequency at a transmission distance of 60 mm, and FIG. 8C is a graph illustrating the output voltage of the reception unit 200 and the response characteristics of the transmission efficiency according to changes in frequency at a transmission distance of 20 mm.

As illustrated in FIG. 8, the method of detecting an optimal resonance frequency according to an embodiment of the present invention is to use the first system or the second system, and may be applied with either the downward variation method of detecting a frequency or the upward variation method of detecting a frequency, in cases when the system is initially matched and optimized to 205.8 kHz at a transmission distance of 80 mm (FIG. 8A), and when an optimal resonance frequency is re-detected at different conditions of a transmission distance of 60 mm (FIG. 8B) and 20 mm (FIG. 8C). An optimal resonance frequency corresponding to each of the detection conditions with different transmission distances may be found, and it can be seen that the optimal resonance frequency becomes smaller proportionally as the transmission distance becomes smaller, and it can be seen that the frequency range between the optimal resonance frequencies detected by the methods of ① and ② becomes wider as the transmission distance becomes smaller according to each condition. That is, it can be seen that the optimal resonance frequency may appear over a wide range as the transmission distance gets closer.

That is, as illustrated in FIG. 8, it can be seen that the results of an optimized resonance frequency that meets all the detection conditions may be detected and found. (Red dotted line) Here, the output voltage determination value of the reception unit 200 for the detection of an optimal resonance frequency is exemplified as 5V.

Figure 9:
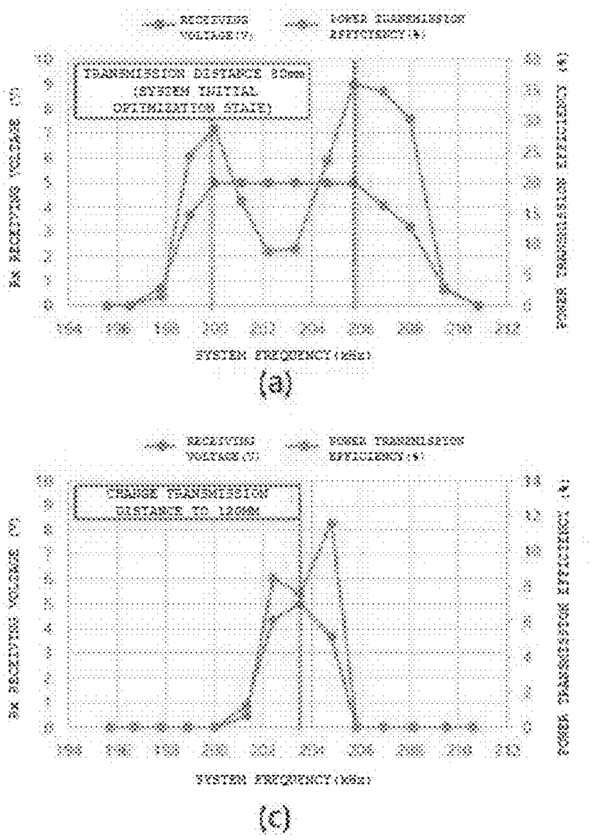
FIG. 9 illustrates graphs of experimental response characteristics of detecting an optimal resonance frequency while increasing a transmission distance using the method of detecting an optimal resonance frequency according to an embodiment of the present invention.

FIG. 9 is graphs illustrating response characteristics of the output voltage of the reception unit 200 and transmission efficiency according to changes in frequency using the method of detecting an optimal resonance frequency according to an embodiment of the present invention, and illustrates graphs of experimental response characteristics of detecting an optimal resonance frequency while increasing a transmission distance.

FIG. 9A is a graph illustrating the output voltage of the reception unit 200 and the response characteristics of the transmission efficiency according to changes in frequency at a transmission distance of 80 mm, FIG. 9B is a graph illustrating the output voltage of the reception unit 200 and the response characteristics of the transmission efficiency according to changes in frequency at a transmission distance of 100 mm, and FIG. 9C is a graph illustrating the output voltage of the reception unit 200 and the response characteristics of the transmission efficiency according to changes in frequency at a transmission distance of 120 mm.

As illustrated in FIG. 9, the method of detecting an optimal resonance frequency according to an embodiment of the present invention uses the first system or the second system, and may be applied with either the downward variation method of detecting a frequency or the upward variation method of detecting a frequency, in cases when the system is initially matched and optimized to 205.8 kHz at a transmission distance of 80 mm (FIG. 8A), and when an optimal resonance frequency is re-detected at different conditions of a transmission distance of 100 mm (FIG. 8B) and 120 mm (FIG. 8C). An optimal resonance frequency corresponding to each of the detection conditions with different transmission distances may be found, and it can be seen that the frequency range between the optimal resonance frequencies detected by the methods of ① and ② is narrowing as the transmission distance becomes greater according to each condition. That is, it can be seen that as the transmission distance becomes shorter, the frequency range over which the output voltage is measured as the determination value widens because it becomes easier to receive power than the initially set system, and as the transmission distance becomes farther, the stable range of the output voltage tends to decrease because it becomes more difficult to receive power due to less magnetic coupling.

Therefore, when the system is designed, it is desirable to optimize the matching circuit with reference to a farthest transmission distance, and then operate the system to apply the method of detecting an optimal resonance frequency while reducing the transmission distance.

Figure 10:
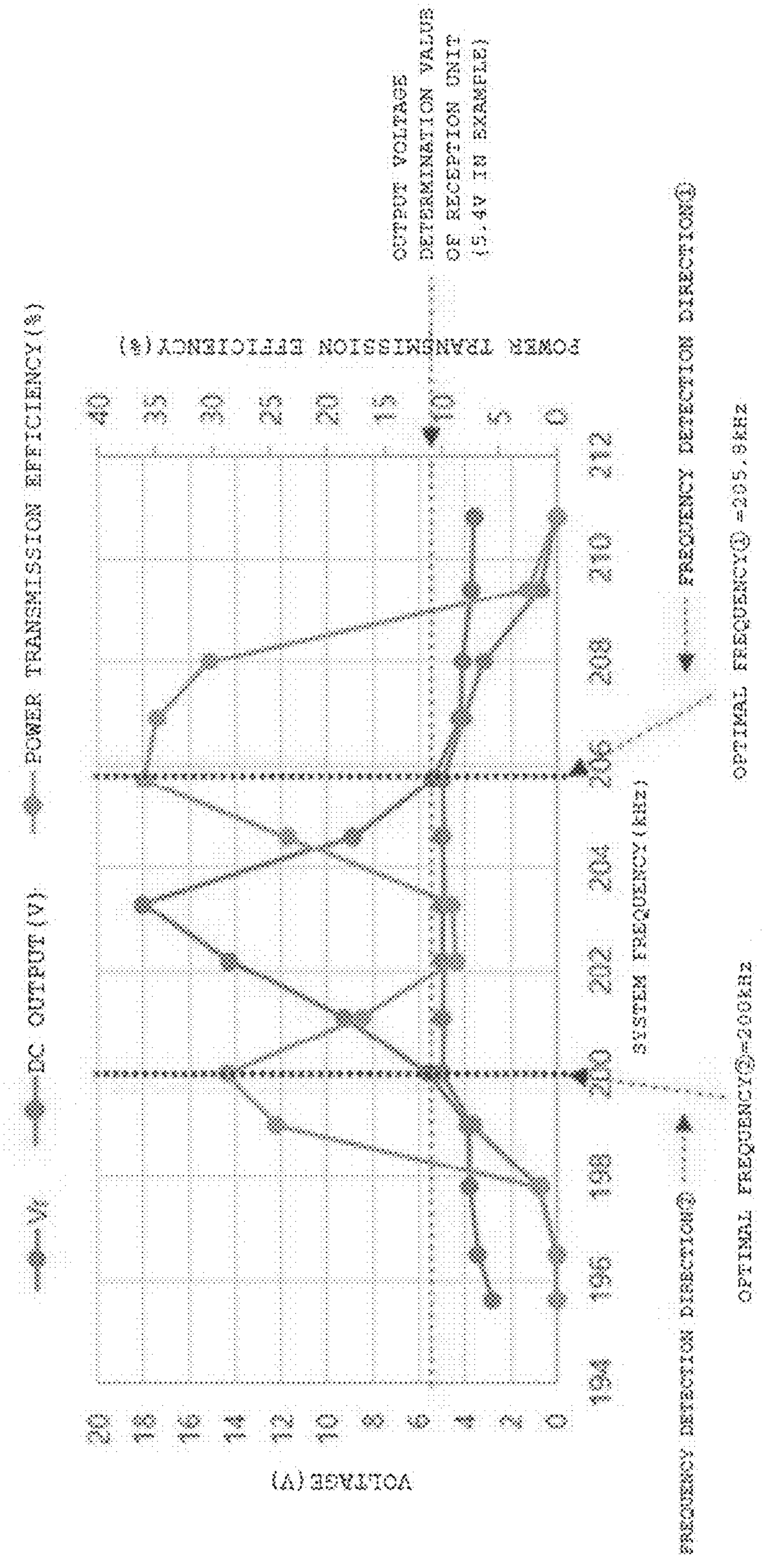
FIG. 10 illustrates a graph of frequency response characteristics in which the method of detecting an optimal resonance frequency according to another embodiment of the present invention is applied.

FIG. 10 illustrates a graph of frequency response characteristics in which the method of detecting an optimal resonance frequency according to another embodiment of the present invention is applied.

As illustrated in FIG. 10, the method of detecting an optimal resonance frequency according to an embodiment of the present invention uses the second system and the fourth system, and FIG. 10 illustrates a graph of the frequency response characteristics obtained by detecting an optimal resonance frequency using the input current value of the transmission unit 100, the output current value of the reception unit 200, and the stabilization voltage value Vr according to frequency variations within a preset system frequency variable range through the process of detecting an optimal resonance frequency illustrated in FIG. 1 and FIG. 4.

As illustrated in FIG. 10, the method of detecting an optimal resonance frequency according to an embodiment of the present invention uses a second system and a fourth system, and since it may be found that the DC output voltage value is stably maintained at 5V when the value of the measured stabilization output voltage Vr is 5.4V or more, when the receiving voltage determination value upon detecting an optimal resonance frequency is 5.4V or more, using a stabilization output voltage Vr measured between the stabilization circuit 230 of the reception unit 200 and the DC/DC conversion circuit 240, a detection method of determining the resonance frequency at which the value is 5.4V or more as an optimal resonance frequency while monitoring the value of the stabilization output voltage Vr is exemplified.

In addition, as another embodiment illustrated in FIG. 10, the method illustrated in FIG. 10 may be a detection method of calculating power transmission efficiency using the measured input current value, the output current value, and the stabilization output voltage value Vr along with a resonance frequency at which the stabilization output voltage value Vr is 5.4 V or more, and determining an optimal resonance frequency using a maximum value among at least one of the values of the calculated power transmission efficiency. The system frequencies of the point of the maximum value exhibit the highest power transmission efficiency at 200 kHz and 205.8 kHz, and comparing the power transmission efficiency at the two system frequencies, it can be seen that the maximum power transmission efficiency is exhibited at 205.8 kHz, so that 205.8 kHz may be determined as an optimal resonance frequency. As described in the embodiments of FIG. 1 and FIG. 4, the downward variation detection method of ① and the upward variation detection method of ② may be applied within the preset system frequency variable range for a direction of detecting the frequency, and an optimal resonance frequency determined according to the direction of detecting the frequency may vary.

Figure 11:
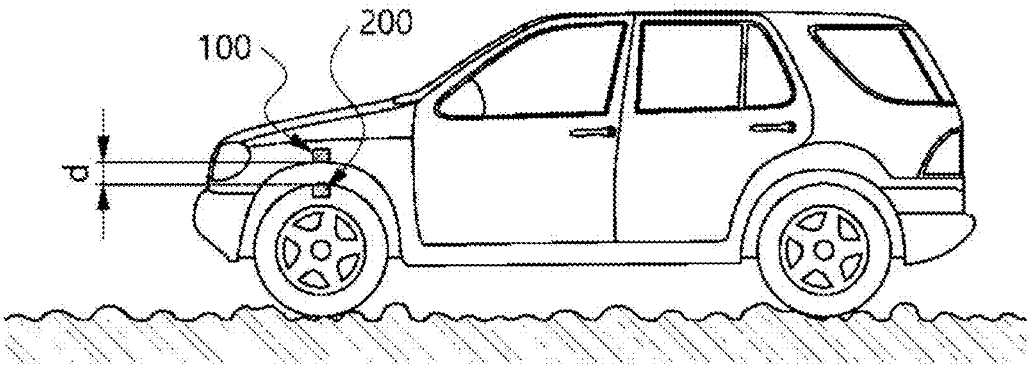
FIG. 11 is a schematic view illustrating the system for detecting an optimal resonance frequency according to an embodiment of the present invention being applied to a wheel of a vehicle.
Figure 11:
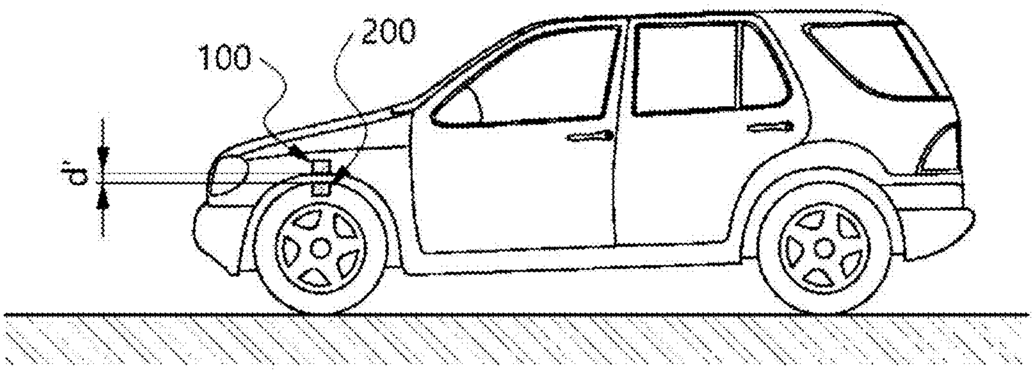

FIG. 11 is a schematic view illustrating the system for detecting an optimal resonance frequency according to an embodiment of the present invention being applied to a vehicle.

The vehicle may be provided with a tire pressure sensor to monitor whether the air pressure inside a tire is maintained in a predetermined range for safe driving. The air pressure sensor (TPMS, Tire Pressure Monitoring System) is generally manufactured to be integrated with a tire inflation valve and is configured to measure the air pressure and transmit the data wirelessly, and a receiver is configured to monitor the air pressure by identifying each of four tire IDs.

The air pressure sensor may be configured to employ a mercury cell or the like as a power source and be replaced together with the tire replacement and the like. However, tire replacement timing may vary depending on driving habits and other factors. When using a wireless power transmission method for the tire pressure sensor, it is possible to extend the lifespan of the air pressure sensor and prevent tire pressure measurement failure due to battery discharge.

Accordingly, when at least one reception unit 200 is mounted inside the tire and the transmission unit 100 is installed inside the wheelhouse of the vehicle, the reception unit 200 and the transmission unit 100 may be disposed in close proximity and may wirelessly transmit power when the tire rotates one revolution.

The recently introduced vehicles may be provided with a variable suspension apparatus that can change the height of the vehicle according to a state of a road surface to alleviate shock and increase ride comfort, and since a distance between the transmission unit in the wheelhouse and the reception unit in the tire may be changed according to the height changed by the variable suspension apparatus, the power transmission efficiency between the transmission unit and the reception unit may be changed together according to the change in height.

That is, as illustrated in FIG. 11A, in an environment such as off-road where the road surface is uneven, a transmission distance d, which is an adjustment distance of the variable suspension, may be increased to prevent interference of the bottom surface of the vehicle with an obstacle on the road surface and the like and prevent damage to the vehicle, and as illustrated in FIG. 11B, in an environment such as on-road where the road surface is even, a transmission distance d' may be decreased to maximize steering performance and minimize rolling or swaying of the vehicle and the like. However, when the adjustment distance of the variable suspension is changed, the distance between the transmission unit 100 and the reception unit 200 inside the wheelhouse is changed, and the wireless power transmission efficiency changes accordingly, and therefore, there is a need for measures to ensure a stable power supply of the air pressure sensor.

Figure 12:
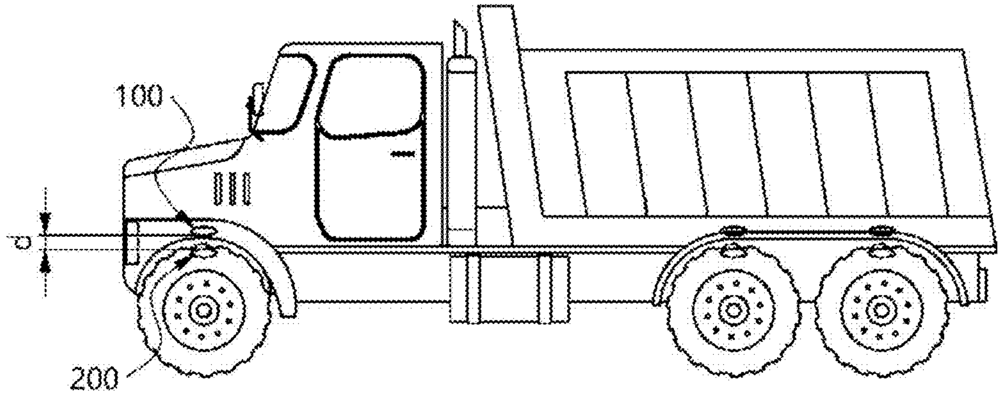
FIG. 12 is a schematic view illustrating the system for detecting an optimal resonance frequency according to an embodiment of the present invention being applied after a tire of a truck has been changed.

FIG. 12 is a schematic view illustrating the system for detecting an optimal resonance frequency according to an embodiment of the present invention being applied after a tire of a truck has been changed.

In the case of a cargo truck illustrated in FIG. 12, there is a stronger need to monitor tire pressure than for a passenger vehicle because the damage in an accident caused by tire damage is significant.

When an industrial large vehicle such as a cargo truck is equipped with various sensors that can monitor the state of tires and the like, since it is necessary to supply power wirelessly to the sensors, a power transmission system including the transmission unit 100 (Tx) inside a wheel fender and the reception unit 200 (Rx) inside a wheel tire may be provided.

In the case of the cargo truck, when replacing tires, the distance between a transmitter and a receiver may change when a different specification of tire is mounted on the same wheel, or when the thickness of the tire changes due to the wear of the tire.

Therefore, in order to secure wireless power transmission efficiency even when a variable suspension apparatus is applied, or when the specification of the tire is changed for various reasons, a wireless power transmission system having optimal power transmission efficiency may be provided by detecting an optimal resonance frequency by changing the system frequency at the initial setting in conjunction with the operation of the variable suspension or after the tire is replaced.

That is, in the case of the variable suspension and the like, the system may be configured to detect an optimal frequency after the operation of the variable suspension or at a predetermined time interval, and may also detect an optimal frequency after a tire replacement to maximize the power transmission efficiency.

Therefore, the wireless power transmission system capable of detecting an optimal resonance frequency to transmit maximum power can be provided even when a distance between a wheel and a vehicle body, that is, the transmission distance d, changes due to the operation of a variable suspense by applying the system for detecting an optimal resonance frequency according to an embodiment of the present invention.

In order to detect an optimal resonance frequency for transmitting maximum power to the power transmission system as described above, at an initial setting after replacing a tire, a frequency is varied and an optimal resonance frequency is detected according to the method of detecting an optimal resonance frequency according to an embodiment of the present invention, and wireless power having optimal power transmission efficiency may be supplied to various sensors installed on the wheels of an industrial vehicle such as a truck.

While the present invention has been described above with reference to the exemplary embodiments, it may be understood by those skilled in the art that the present invention may be variously modified and changed without departing from the spirit and scope of the present invention disclosed in the claims. Therefore, it should be understood that any modified embodiment that essentially includes the constituent elements of the claims of the present invention is included in the technical scope of the present invention.

The invention claimed is:

1. A method of detecting an optimal resonance frequency for maximum power transmission, in a method of detecting a resonance frequency of a wireless power transmission system using magnetic resonant coupling of a transmission unit and a reception unit, the method comprising:
(a) setting a system frequency within a preset frequency variable range and transmitting power from the transmission unit to the reception unit;
(b) measuring an output voltage value of the reception unit according to the system frequency that is set;
(c) determining a resonance frequency as an optimal resonance frequency when the measured output voltage value is equal to or greater than a preset receiving voltage determination value; and
(d) repeating step (a), (b) and (c) by varying the system frequency within the frequency variable range.

2. A method of detecting an optimal resonance frequency for maximum power transmission, in a method of detecting a resonance frequency of a wireless power transmission system using magnetic resonant coupling of a transmission unit and a reception unit, the method comprising:
(a) setting a system frequency within a preset frequency variable range and transmitting power from the transmission unit to the reception unit, (b) measuring a current value of the transmission unit, an output voltage value and an output current value of the reception unit according to the system frequency that is set, (c) calculating power transmission efficiency using a current value of the transmission unit measured at the resonance frequency, and an output voltage value and output current value of the reception unit measured at the resonance frequency, when the measured output voltage value is equal to or greater than a preset receiving voltage determination value, (d) repeating steps starting from step (a) by varying the system frequency within the frequency variable range, and (e) determining a maximum value of the calculated power transmission efficiency as an optimal resonance frequency.

3. The method of claim 1, wherein the frequency variation is an upward variation, where the system frequency varies to a higher frequency than the system frequency of the previous step, or a downward variation, where the system frequency varies to a lower frequency than the system frequency of the previous step.

4. The method of claim 1, wherein the frequency variation is to vary the system frequency at predetermined intervals within a preset frequency variable range.

5. The method of claim 1, wherein the preset frequency variable range is set within a system frequency range within which power transmission using magnetic resonant coupling of the transmission unit and the reception unit is possible.

6. The method of claim 1, wherein the output voltage value is a DC output voltage value or a stabilization output voltage value of the reception unit.

7. The method of claim 6, wherein the receiving voltage determination value for the measured stabilization output voltage value Vr is greater than the receiving voltage determination value for the measured DC output voltage value V.

8. A wireless power transmission system for detecting an optimal resonance frequency using magnetic resonant coupling, the wireless power transmission system comprising:
a transmission unit including an AC/DC conversion circuit, a DC/RF conversion circuit, a matching circuit, a control circuit, and a communication circuit to transmit power; and
a reception unit including a matching circuit, a rectification circuit, a stabilization circuit, a DC/DC conversion circuit, a control circuit, and a communication circuit to receive power from the transmission unit,
wherein the transmission unit transmits power to the reception unit by varying a system frequency within a preset frequency variable range and determines at least one of frequencies at which an output voltage measured at the reception unit is equal to or greater than the preset receiving voltage determination value as an optimal resonance frequency.

9. The wireless power transmission system of claim 8, wherein the output voltage value is a DC output voltage value V or a stabilization output voltage value Vr measured between the stabilization circuit and the DC conversion circuit of the reception unit.

10. The wireless power transmission system of claim 8, wherein the current value of the transmission unit is an input current value A measured between the AC/DC conversion circuit and the DC/RF conversion circuit, or an input current value A measured between the DC/RF conversion circuit and the matching circuit.

11. The wireless power transmission system of claim 8, wherein varying the system frequency is to increase a frequency from a lowest frequency within a preset frequency variable range, or to decrease a frequency from a highest frequency within a preset frequency variable range.

12. The wireless power transmission system of claim 8, wherein varying the system frequency is to vary the system frequency at predetermined time intervals within a preset frequency range.

13. The method of claim 2, wherein the frequency variation is an upward variation, where the system frequency varies to a higher frequency than the system frequency of the previous step, or a downward variation, where the system frequency varies to a lower frequency than the system frequency of the previous step.

14. The method of claim 2, wherein the frequency variation is to vary the system frequency at predetermined intervals within a preset frequency variable range.

15. The method of claim 2, wherein the preset frequency variable range is set within a system frequency range within which power transmission using magnetic resonant coupling of the transmission unit and the reception unit is possible.

16. The method of claim 2, wherein the output voltage value is a DC output voltage value or a stabilization output voltage value of the reception unit.

17. The method of claim 16, wherein the receiving voltage determination value for the measured stabilization output voltage value Vr is greater than the receiving voltage determination value for the measured DC output voltage value V.

* * * * *